(12) United States Patent
Waldner et al.

(10) Patent No.: US 12,406,836 B2
(45) Date of Patent: Sep. 2, 2025

(54) DEVICE AND METHOD FOR PLASMA GENERATION IN A WIDE PRESSURE RANGE AND SYSTEM AND METHOD FOR OPTICAL GAS ANALYSIS/DETECTION BY MEANS OF SUCH A DEVICE

(71) Applicant: INFICON AG, Balzers (LI)

(72) Inventors: Astrid Waldner, Bad Ragaz (CH);
Bernhard Andreaus, Rapperswil (CH);
Urs Wälchli, Chur (CH); Stefan Kaiser, Ruggell (LI)

(73) Assignee: INFICON AG, Balzers (LI)

( * ) Notice: Subject to any disclaimer, the term of this patent is extended or adjusted under 35 U.S.C. 154(b) by 137 days.

(21) Appl. No.: 18/285,042

(22) PCT Filed: Mar. 21, 2022

(86) PCT No.: PCT/EP2022/057384
§ 371 (c)(1),
(2) Date: Sep. 29, 2023

(87) PCT Pub. No.: WO2022/207396
PCT Pub. Date: Oct. 6, 2022

(65) Prior Publication Data
US 2024/0177979 A1 May 30, 2024

(30) Foreign Application Priority Data
Mar. 31, 2021 (CH) ................................. 00342/21

(51) Int. Cl.
*H01J 37/32* (2006.01)
*H01J 37/34* (2006.01)

(52) U.S. Cl.
CPC .. *H01J 37/32981* (2013.01); *H01J 37/32018* (2013.01); *H01J 37/32211* (2013.01);
(Continued)

(58) Field of Classification Search
None
See application file for complete search history.

(56) References Cited

U.S. PATENT DOCUMENTS 10,734,200 B2 * 8/2020 Chen ................. H01J 37/32027
2010/0224322 A1 9/2010 Sui et al.

FOREIGN PATENT DOCUMENTS

EP 3702760 A1 9/2020
WO 2021/052600 A1 3/2021

OTHER PUBLICATIONS

International Search Report (with translation) and Written Opinion received in corresponding International Application No. PCT/EP2022/057384, mailed Jul. 7, 2022, in 15 pages.

* cited by examiner

*Primary Examiner* — Kenneth B Wells
(74) *Attorney, Agent, or Firm* — Procopio, Cory, Hargreaves & Savitch LLP

(57) ABSTRACT

The present invention relates to a device for plasma generation in a wide pressure range. The device comprises a first plasma source (1) in a first discharge chamber (2) in order to generate a first plasma in a low-pressure range, a second plasma source (3) in a second discharge chamber (4) in order to generate a second plasma in a high-pressure range, a first coupling element (5) for coupling the device to a system, in order to guide gas out of the system, and a second coupling element (6) for coupling the device to an optical sensor (12). The first discharge chamber (2) has a first optical connection with at least one optical lens (7, 8) to the second coupling element (6) and the second discharge chamber (4) has a second optical connection with at least one optical lens (8) to the second coupling element (6). This invention further (Continued)

relates to a system for optical gas analysis or gas detection and corresponding methods for plasma generation and for operating the system.

20 Claims, 3 Drawing Sheets

(52) U.S. Cl.
CPC .... *H01J 37/3244* (2013.01); *H01J 37/32825* (2013.01); *H01J 37/32972* (2013.01); *H01J 37/3447* (2013.01)

DEVICE AND METHOD FOR PLASMA GENERATION IN A WIDE PRESSURE RANGE AND SYSTEM AND METHOD FOR OPTICAL GAS ANALYSIS/DETECTION BY MEANS OF SUCH A DEVICE

CROSS-REFERENCE TO RELATED APPLICATIONS

This application is a U.S. National Stage entry of International Application No: PCT/EP2022/057384, filed Mar. 21, 2022, which claims the benefit of CH 00342/21, filed on Mar. 31, 2021, which is a U.S. patent application Ser. No. 18/285,201, filed on Sep. 29, 2023, now being U.S. Pat. No. 12,096,545, the contents of which are incorporated herein by reference.

RELATED APPLICATIONS

Parallel to the present application, a Swiss patent application entitled "Vacuum feedthrough, electrode assembly and device for generating a silent plasma discharge" was filed on the same day by the same applicant as the present patent application. The contents of the said application are hereby incorporated into the present patent application on the basis of the said reference.

TECHNICAL FIELD OF THE INVENTION

The present invention relates to a device and a method for plasma generation. Further, the invention relates to a system for optical gas analysis and/or gas detection, for example a measuring device for determining a gas composition or for detecting a particular gas, by means of such a device, and a method for operating the system.

The present invention belongs to the technical field of plasma generation, the ionization and excitation of molecules and ions to produce plasma light, and further the measurement and evaluation of information about the gas composition of the generated plasma.

BACKGROUND OF THE INVENTION

Optical emission spectrometry (OES) is frequently used for the quantitative and qualitative analysis of gaseous samples. The method is based on the fact that excited atoms emit electromagnetic radiation characteristic of the chemical element and thus provide information about the composition of the sample. The excitation of the atoms is achieved, for example, by converting the sample to the plasma state. Known instruments for carrying out optical emission spectrometry each use a specific plasma source where plasma generation operates in a long-lived and stable manner over a defined pressure range. However, many applications involve a very wide pressure range in which the gas composition plays a significant role and therefore needs to be measured and controlled or monitored. Therefore, a large number of plasma-generating instruments are needed, which leads to a high effort in electronics, software, space, energy and costs. Thus, multiple measuring instruments such as spectrometers and also multiple flange ports are required in the system where the gas is to be analyzed over a wide pressure range.

Therefore, there is a need to develop instruments that allow stable generation of a plasma and its emission light in or over a wide pressure range, e.g., from $10^{-8}$ Torr (high vacuum) to 1500 Torr (>normal pressure), with minimal space requirements and as little electronics, software, energy, and cost as possible.

SUMMARY OF THE INVENTION

One object of the present invention is to provide a device for plasma generation in (or over) a wide pressure range, which can be connected to a plant (or system) from which a gas is to be analyzed and/or detected in the most space-saving manner possible, and is less complicated and more cost-saving compared to known devices for plasma generation. According to the invention, this object is solved by the device according to claim 1.

It is further an object of the present invention to disclose a system for optical gas analysis or gas detection, respectively, which comprises such an advantageous device for plasma generation. This object is solved by the system according to claim 16.

It is also an object of the present invention to propose a corresponding method for plasma generation in (or over) a wide pressure range. Such a method is specified in claim 17.

It is further an object of the present invention to propose a corresponding method for optical gas analysis or gas detection. Such a method is disclosed in claim 20.

Specific embodiment variants according to the invention are given in the dependent claims.

A device according to the invention for plasma generation in a wide pressure range comprises:

- a first plasma source, wherein the first plasma source is arranged in a first discharge chamber and is adapted to generate a first plasma in a low-pressure range, wherein the low-pressure range extends in particular up to high vacuum, i.e. for example to $10^{-8}$ Torr;
- a second plasma source, wherein the second plasma source is arranged in a second discharge chamber and is adapted to generate a second plasma in a high-pressure range, wherein the high-pressure range extends in particular to above normal pressure, i.e. for example to 1500 Torr;
- a first coupling element, in particular having a flange, for coupling the device to a system (in particular a gas source), wherein the coupling element is designed to lead gas out of the system;
- a second coupling element for coupling the device to an optical sensor, such as a photodiode or spectrometer, for optical gas analysis or gas detection (or gas pressure measurement), wherein the first discharge chamber has a first optical connection having at least one optical lens to the second coupling element, and the second discharge chamber has a second optical connection having at least one optical lens to the second coupling element (wherein the optical lens may be a common optical lens of the first and second optical connections).

The device according to the invention is therefore characterized in that it can generate at least two different forms of discharge, i.e. it has two or more plasma sources integrated (together) in this (single) device. Further, the device has only one (connection) flange with which it can be connected to the system with the gas to be analyzed, and it also has only one coupling to a (single) optical sensor, such as a spectrometer, to perform the optical gas analysis in the whole pressure range, e.g. from $10^{-8}$ Torr to 1500 Torr. The (two) discharge chambers of the (two) plasma sources may be arranged in parallel or in a row (in series, one behind the other), and the gas to be analyzed or detected may be fed in parallel to the individual discharge chambers or passed from one discharge chamber to the next. It is also conceivable to have a combination of discharge chambers arranged in parallel/next to each other and in rows/series with plasma sources that are fluidically connected to each other or are decoupled in a gas-tight manner.

The light emitted by the respective plasma is guided via an optical connection from the respective discharge chamber to the second coupling element (in front of the optical sensor). In this context, each optical connection has an optical lens, wherein e.g. two optical connections can also have a common optical lens. In addition to one or more optical lenses, the optical connections can also comprise, for example, suitable light guide (s) such as fibers, tubes or rods.

In one embodiment variant of the device, the low-pressure range and the high-pressure range together extend over a specific pressure range.

In a further embodiment variant of the device, the low-pressure range and the high-pressure range overlap, in particular over a pressure range from 0.35 Torr to 3.5 Torr.

In a further embodiment variant of the device, the first and second plasma sources are different plasma sources, e.g. one each from the group consisting of a glow discharge source (cold cathode source), a silent discharge source (dielectric barrier discharge, DBD), a radio frequency plasma source (RF plasma source), a microwave plasma source (→normal/atmospheric pressure plasma source), and an inductively coupled plasma source (ICP source).

In a further embodiment variant of the device, the first discharge chamber is fluidically coupled to the second discharge chamber (in particular, the same or nearly the same pressure prevails in both discharge chambers).

In a further embodiment variant of the device, the first discharge chamber is decoupled from the second discharge chamber in a gas-tight manner.

In a further embodiment variant of the device, gas can be supplied from the first coupling element into the first discharge chamber and can be supplied from the first discharge chamber into the second discharge chamber.

In a further embodiment variant of the device, gas from the first coupling element can be supplied separately to the first discharge chamber and to the second discharge chamber.

In a further embodiment variant of the device, an optical lens, which is part of the first optical connection, is arranged between the first discharge chamber and the second discharge chamber.

In further embodiment variant of the device, the second coupling element comprises an optical lens which is part of the first and/or the second optical connection.

In a further embodiment variant of the device, the second optical connection is part of the first optical connection, i.e. the two optical connections overlap partially or in sections.

In a further embodiment variant, the device further comprises a pressure sensor. For example, the pressure sensor may be one of the following:
  Heat conduction vacuum meter according to Pirani (for a measuring range approx. from $10^{-3}$ Torr to 1 Torr);
  ionization vacuum gauge with cold cathode according to Penning (for a measuring range from approx. $10^{-7}$ Torr to $10^{-3}$ Torr);
  ionization vacuum gauge with Bayard-Alpert hot cathode (for a measuring range from approx. $10^{-12}$ Torr to $10^{-3}$ Torr);
  capacitance diaphragm (vacuum) gauge (CDG; for a measuring range from approx. $10^{-5}$ Torr to $10^{-3}$ Torr).

To cover a wide pressure range, e.g. from $10^{-8}$ Torr to 1500 Torr, the device can also have multiple pressure sensors.

In a further embodiment variant, the device further comprises a controller which is designed to control the first and/or the second plasma source, in particular to switch the first and/or the second plasma source on or off, as a function of the pressure (or pressures) determined by means of the pressure sensor (s).

In a further embodiment variant of the device, the first discharge chamber and the second discharge chamber are of cylindrical design and are arranged coaxially (on a common cylinder axis) one behind the other (in series), wherein the first coupling element is arranged on the first discharge chamber and the second coupling element is arranged on the second discharge chamber, wherein the first plasma source is in particular a glow discharge source (cold cathode source) and wherein the second plasma source is in particular a silent discharge source (for dielectric barrier discharge).

In a further embodiment of the device, an anode of the first plasma source is glazed in a vacuum-tight manner in a feedthrough through the optical lens in the second coupling element, and in particular also (e.g. in a vacuum-tight manner) in a feedthrough through the optical lens, which is arranged between the first discharge chamber and the second discharge chamber, and the two feedthroughs are arranged in particular centrally in the two optical lenses, and the anode extends coaxially (on the common cylinder axis of the two discharge chambers) through the second discharge chamber into the first discharge chamber.

In a further embodiment variant of the device, the second plasma source has a high-voltage electrode and a ground electrode, wherein the high-voltage electrode is embedded in a dielectric which forms at least part of an inner wall of the second discharge chamber, and the ground electrode is arranged concentrically to the high-voltage electrode within the second discharge chamber and along the inner wall, at a distance of less than 1 mm, in particular between 0.05 mm and 0.5 mm, from the high-voltage electrode, in particular on a hollow cylinder, e.g. of ceramic, wherein a gap is located between the inner wall and the ground electrode, in which gap a discharge zone with a plasma (namely the second plasma) is formed when an alternating voltage is applied between the high-voltage electrode and the ground electrode, e.g. with a voltage in the range of ±1 to ±10 kV and a frequency in the range of 1 to 10 KHz. For example, the voltage curve may change from −5 kV to +5 kV and back again over one period of the AC voltage, i.e., a voltage of 10 $kV_{pp}$ (peak-to-peak) may be applied. The voltage curve can correspond to a sinusoidal curve, for example. A square-wave voltage is also possible. It is advantageous to vary the voltage from positive to negative with respect to ground potential. In this way, a much more stable plasma is obtained than, for example, by varying between zero (GND) and positive voltage or between zero (GND) and negative voltage. The high-voltage electrode and ground electrode can, for example, both be formed as thin-walled hollow cylinders. These two electrodes can also be segmented, for example, i.e. constructed from conductive strips which lie next to each other on a cylindrical surface.

In a further embodiment variant of the device, the high-voltage electrode is connectable to ground (e.g., switchable/controlled) for operation of the first plasma source and is connectable to a high-voltage alternating current source (e.g., switchable/controlled) for operation of the second plasma source, and/or wherein the anode is connectable (e.g. switchable/controlled) to a high-voltage direct current source (e.g. 3.3 kV DC voltage) for operation of the first plasma source and is connectable to ground (e.g. switchable/controlled) for operation of the second plasma source.

In a further embodiment variant of the device, a coaxial arrangement of the anode (in particular) within the first discharge chamber, with the discharge chamber serving as a cathode, and a radial arrangement of the high-voltage electrode and of the ground electrode (on the inner wall of the second discharge chamber) result in a first plasma generated by the first plasma source forming on the cylinder axis of the first discharge chamber and in first light emitted by the first plasma propagating in particular axially towards the second coupling element, and in that a second plasma generated by the second plasma source forms on the inner wall of the second discharge chamber and second light emitted by the second plasma propagates in particular obliquely to the cylinder axis of the second discharge chamber towards the second coupling element, so that the first light and the second light strike the optical lens in the second coupling element from different directions.

In a further embodiment variant of the device, the is anode made of molybdenum.

In a further embodiment variant of the device, the first discharge chamber is made of titanium.

In a further embodiment variant of the device, the high voltage electrode is made of platinum.

In a further embodiment variant of the device, the dielectric is made of sapphire ($Al_2O_3$).

In a further embodiment variant of the device, the ground electrode is made of molybdenum.

In a further embodiment variant of the device, the optical lens or lenses are made of sapphire ($Al_2O_3$).

According to another aspect of the present invention, a system for optical gas analysis or gas detection (or gas pressure measurement) comprises:
  a device for plasma generation according to one of the above embodiment variants;
  a gas source, wherein the device for plasma generation is coupled to the gas source with a first coupling element, in particular with a flange;
  an optical sensor, such as a photodiode or spectrometer for optical gas analysis or gas detection (or gas pressure measurement), wherein the plasma generation device is coupled to the optical sensor by a second coupling element.

According to another aspect of the present invention, a method for plasma generation in a wide pressure range by means of the plasma generation device according to one of the embodiment variants disclosed above comprises the following steps:
  feeding a gas from a system via a first coupling element into a first discharge chamber having a first plasma source and/or into a second discharge chamber having a second plasma source;
  generating a first plasma by the first plasma source in a low-pressure range in the first discharge chamber, wherein the low-pressure range extends in particular to high vacuum, i.e., for example, to $10^{-8}$ Torr, and/or generating a second plasma by the second plasma source in a high-pressure range in the second discharge chamber, wherein the high-pressure range extends in particular to above normal pressure, i.e., for example, to 1500 Torr;
  guiding light which is emitted from the first plasma from the first discharge chamber via a first optical connection having at least one optical lens and/or light emitted from the second plasma from the second discharge chamber via a second optical connection having at least one optical lens to a second coupling element for coupling the device to an optical sensor, such as a photodiode or a spectrometer;
  coupling out at least a portion of the light, which is emitted from the first and/or the second plasma, by the second coupling element.

In one embodiment variant of the method, the second plasma source is a silent discharge source having a high-voltage electrode and a ground electrode, wherein an AC voltage is applied between the high-voltage electrode and the ground electrode to generate the second plasma, e.g., with a voltage in the range of ±1 to ±10 kV and a frequency in the range of 1 to 10 KHz.

In a further embodiment variant of the method, the first and/or the second plasma source is controlled as a function of the pressure determined with the aid of a pressure sensor, in particular the first and/or the second plasma source is switched on or off.

In a further embodiment variant of the method, in a pressure range in which the low-pressure range and the high-pressure range overlap, e.g., in a pressure range of 0.35 Torr to 3.5 Torr, the first and second plasma sources simultaneously generate a first and a second plasma.

According to a further aspect of the present invention, a method for optical gas analysis or gas detection (or gas pressure measurement) comprises carrying out the steps according to one of the embodiment variants of the method for plasma generation indicated above, and further comprising the following steps:
  directing the decoupled light to an optical sensor, such as a photodiode or spectrometer;
  determining a gas or components of a gas or detecting a specific gas or specific components of a gas (or determining a pressure of a gas) based on the decoupled light, in particular an intensity and/or a spectral distribution of the decoupled light.

Now, if in a pressure range where the low-pressure range and the high-pressure range overlap, e.g., in a pressure range of 0.35 Torr to 3.5 Torr, the first and second plasma sources generate a first and a second plasma simultaneously, this leads to an increased sensitivity of the optical gas analysis or gas detection due to the higher (e.g., double) intensity of the light from both plasmas. This can be useful for trace gas detection, for example. Such simultaneous plasma generation by the first and second plasma sources can also be helpful in identifying or determining the partial fraction of a trace gas (partial pressure/concentration), since the fractionation of the gas by the two plasmas is different. Furthermore, it is possible to use the analysis result of the light from the first (or second) plasma to correct the analysis result of the light from the second (or first) plasma, or to use one for the purpose of calibrating the other.

It should be noted that combinations of the above embodiment variants are possible, which in turn lead to more specific embodiment variants of the present invention.

BRIEF DESCRIPTION OF THE DRAWINGS

Non-limiting exemplary embodiments of the present invention are explained in further detail below with reference to figures, wherein.

In the figures, the same reference signs denote the same elements.

DETAILED DESCRIPTION OF THE INVENTION

Figure 1:
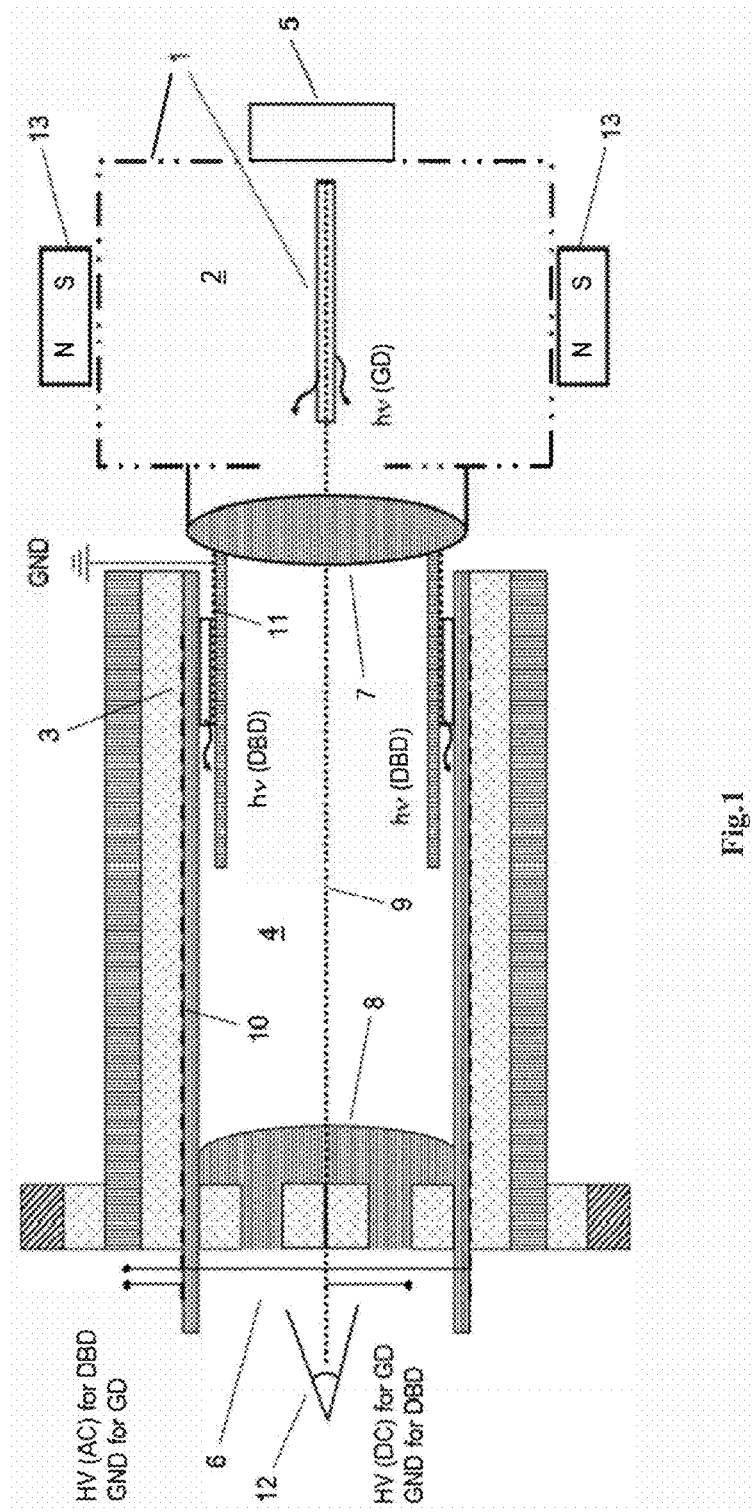
FIG. 1 shows a schematic representation of an exemplary embodiment of a device according to the invention for plasma generation in a wide pressure range.

FIG. 1 shows in a schematic representation an exemplary embodiment of a device according to the invention for plasma generation in a wide pressure range. The device comprises a first plasma source 1, e.g. a glow discharge source (GD, cold cathode source), which is arranged in a first discharge chamber 2, and a second plasma source 3, e.g. a silent discharge source (DBD source), which is arranged in a second discharge chamber 4, wherein the two discharge chambers 2, 4 are arranged one behind the other (in series), adjacent to each other. Further, the device comprises a first coupling element 5, e.g. having a flange, for coupling the device to a system (not shown) in which a gas is present. The gas is fed out of the system into the first discharge chamber 2 via the coupling element 5. From the first discharge chamber 2, the gas can flow into the second discharge chamber 4. For this purpose, there are, for example, several (e.g. 6 to 12) vent holes, each with a diameter of at least 1 mm, between the two discharge chambers 2, 4. Further, the device comprises a second coupling element 6 for coupling the device to an optical sensor, such as a photodiode or a spectrometer, for optical gas analysis or gas detection (or also for gas pressure measurement).

The first plasma source 1 is suitable for generating a plasma in a low-pressure range, e.g. from $10^{-8}$ Torr to about 3.5 Torr, and the second plasma source 2 is suitable for generating a plasma in a high-pressure range, e.g. from about 0.35 Torr to 1500 Torr. Depending on the pressure of the gas, the first (at low pressure→high vacuum) or the second (at atmospheric pressure) plasma source 1, 3 will therefore ignite the gas and thereby generate a first or second plasma 14, 15 which emits different light depending on the type or composition of the gas. In the pressure overlap range of the two plasma sources 1, 3, e.g. from 0.35 Torr to 3.5 Torr, both plasma sources 1, 3 can also be active at the same time and thus generate a first as well as a second plasma 14, 15 simultaneously. This parallel operation of both plasma sources 1, 3 is especially possible because of the low power of both discharges.

The light emitted from the first plasma 14 in the first discharge chamber 2 is guided through an optical lens 7, which is located between the two discharge chambers 2, 4. The light is then guided through the second discharge chamber 4 and passes through a second optical lens 8, which is located in the second coupling element 6, to an optical sensor 12, with the aid of which an optical gas analysis or gas detection (or also a gas pressure measurement) can be carried out. The optical sensor 12 is sensitive in the wavelength range which can be transmitted through the two optical lenses 7, 8. The optical sensor 12 can be a simple radiation sensor, e.g. a light sensor such as a photodiode, but it can also be a more complex optical sensor, e.g. a spectrometer.

The anode 9 of the first plasma source 1 is guided from the second coupling element 6 through the second optical lens 8 in the second coupling element 6 through the second discharge chamber 4 through the first optical lens 7 between the two discharge chambers 2, 4 into the first discharge chamber 2. In particular, the anode 9 is glazed in a vacuum-tight manner in a feedthrough through the optical lens 8 in the second coupling element 6. The anode 9 may also be glazed in a feedthrough through the optical lens 7 between the two discharge chambers 2, 4. The feedthrough through the optical lens 7 can also be designed to be vacuum-tight, although this is not absolutely necessary. The two feedthroughs are arranged in particular centrally in the two optical lenses 7, 8, so that the anode 9 extends coaxially through the second discharge chamber 4 into the first discharge chamber 2. The cathode of the first plasma source 1 is located at the edge of the first discharge chamber 2 spaced from the anode 9. The inner wall of the first discharge chamber 2 may in this case form the cathode. For example, the cathode is made of titanium. To generate a glow discharge of the gas, a high DC voltage (HV DC) of, for example, 3.3 kV is applied between the anode 9 and the cathode. This high voltage accelerates electrons from the cathode material towards the anode 9. By applying an external magnetic field by means of (permanent) magnets 13, the electrons are directed along circular or spiral paths. This increases the probability of collision with an atom/molecule of the gas. These collisions lead to the excitation or ionization of the atom/molecule. The ions migrate towards the cathode, generating an ion current. Photons are generated on the one hand by relaxation of the excited atoms, molecules, ions and on the other hand by recombination of these ions. The emitted photons radiate into the whole space and hit, among others, the first optical lens 7 between the two discharge chambers 2, 4. Here the incoming photons are refracted and directed to the second optical lens 8 in the second coupling element 6. The optical lenses 7, 8 can be made of one or more materials, e.g. sapphire, as well as having an aspherical shape to counteract spherical or chromatic aberration.

The optical wavelength range includes electromagnetic radiation with wavelengths from 100 nm to 1 mm, i.e. in particular the ranges of visible light, ultraviolet radiation and infrared radiation.

Details concerning the second plasma source 3, i.e. the device for generating a silent plasma discharge, can be taken from the Swiss patent application CH 00342/21, filed on Mar. 31, 2021, which is a U.S. patent application Ser. No. 18/285,201, filed on Sep. 29, 2023, now being U.S. U.S. Pat. No. 12,096,545, filed on the same day as the present patent application and entitled "Vacuum feedthrough, electrode assembly and device for generating a silent plasma discharge" by the same applicant as the present patent application. The second plasma source 3 has a high-voltage electrode 10 and a ground electrode 11, wherein the high-voltage electrode 10 is embedded in a dielectric forming at least part of an inner wall of the second discharge chamber 4. The ground electrode 11 is arranged concentrically to the high-voltage electrode 10 on the inner wall of the second discharge chamber 4, in particular on a hollow cylinder, for example made of ceramic. The ground electrode 11 is located at a distance of less than 1 mm from the high voltage electrode 10, wherein a gap is located between the inner wall and the ground electrode 11, in which a discharge zone with the (second) plasma 15 is formed when a high alternating voltage (HV AC) is applied between the high voltage electrode 10 and the ground electrode 11. The inventors have recognized that with this expansion of the gap, a dielectric barrier discharge (DBD) can be stably generated with a high AC voltage in the range ±1 to ±10 kV and a frequency in the range 1 to 10 kHz over a wide pressure range approximately from 0.35 Torr to 1500 Torr.

Figure 2:
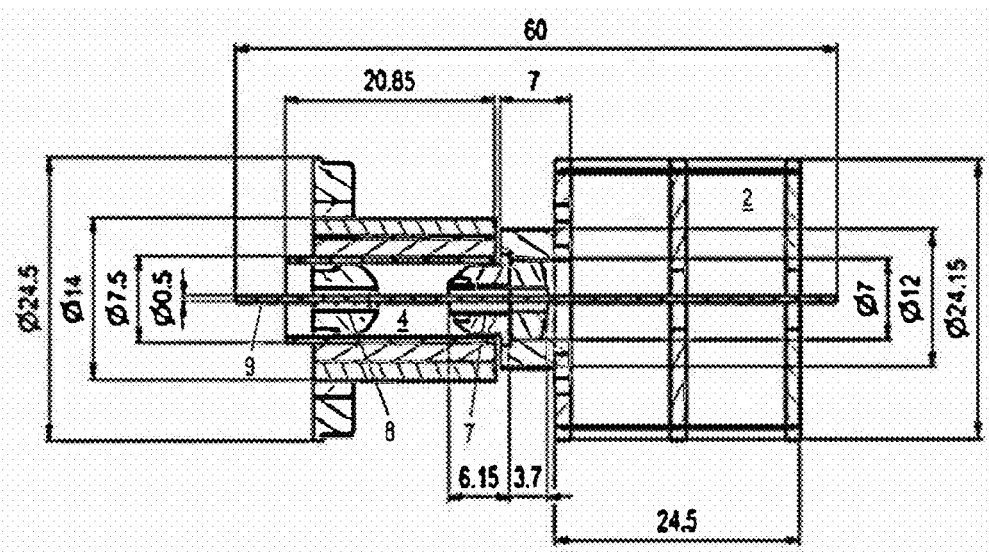
FIG. 2 shows a longitudinal section through an exemplary embodiment of a device according to the invention for plasma generation in a wide pressure range with size details.

In FIG. 2, a longitudinal section through an exemplary embodiment of a device according to the invention for plasma generation in a wide pressure range is shown together with size details. In this embodiment variant, the first discharge chamber 2 and the second discharge chamber 4 are of cylindrical design and arranged coaxially one behind the other ("connected in series", so to speak). As in FIG. 1, the first coupling element 5 is arranged on the right side of the first discharge chamber 2 and the second coupling element 6 is arranged on the left side of the second discharge chamber 4. The overall length of the device in this example is only just about 60 mm and the overall diameter in this example is only about 25 mm. As this shows, the present invention allows for a very compact design, which consequently saves a lot of space.

Figure 3:
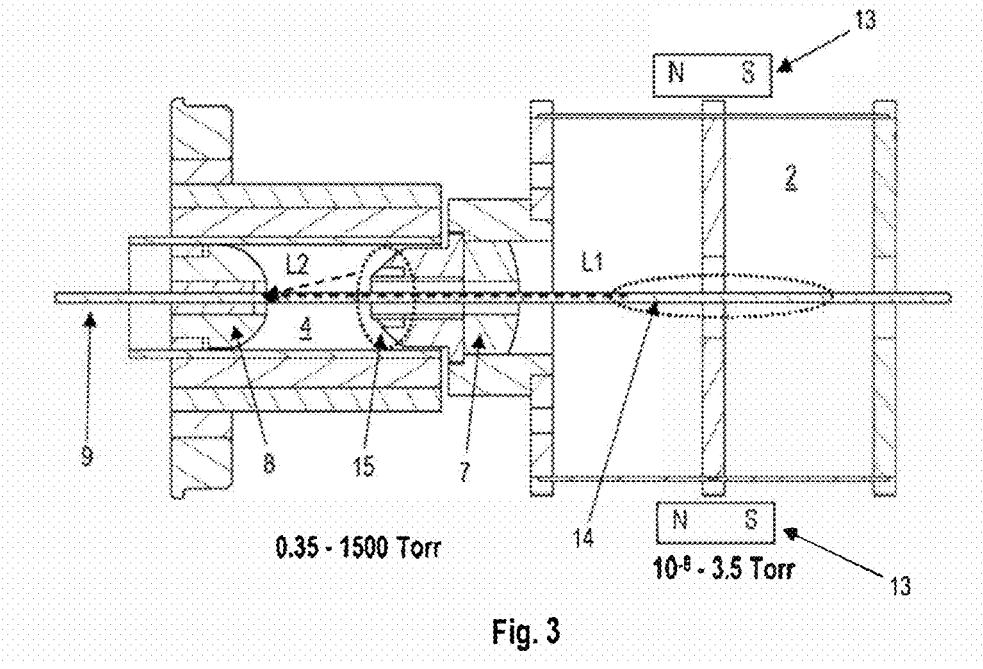
FIG. 3 shows an alternative representation of the longitudinal section through the exemplary embodiment according to FIG. 2 with drawn-in plasma regions.

FIG. 3 shows an alternative representation of the longitudinal section through the exemplary embodiment according to FIG. 2. FIG. 3 also shows the plasmas 14, 15 in the two discharge chambers 2, 4 and schematically indicates the two optical connections L1, L2. The areas in which the plasmas 14, 15 are generated are outlined with dashed lines.

Figure 4:
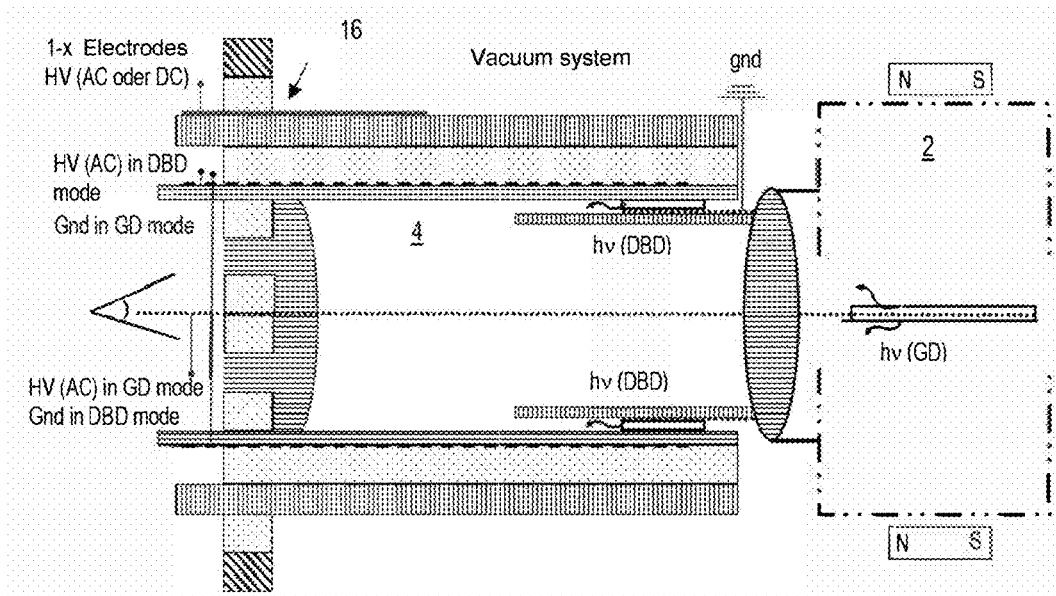
FIG. 4 shows a variant of the device.

FIG. 4 shows a longitudinal section through an embodiment which largely corresponds to the embodiment shown in FIG. 1. In addition, this variant has at least one further electrode 16, which is guided radially outside the high-voltage electrode 10 of the second plasma source and insulated from it from the vacuum side to the outside. This further electrode is guided through, for example, between a fused glass ring and a cylinder of insulating material. The cylinder of insulating material can, for example, project beyond the fused glass ring on both sides in order to form a continuous contact surface for the electrode. A plurality of such further electrodes is possible, wherein the electrodes can, for example, be of strip-shaped design with a longitudinal direction parallel to the longitudinal axis of the device. A plurality of such further electrodes may be distributed in an azimuthal direction and arranged insulated from each other, so that most of them would not be visible or are not visible in this longitudinal sectional view. One or more such electrodes allow for the connection of additional sensors on the vacuum side, or alternative ways of connecting the anodes and cathodes of the first and second plasma sources discussed so far.

Figure 5:
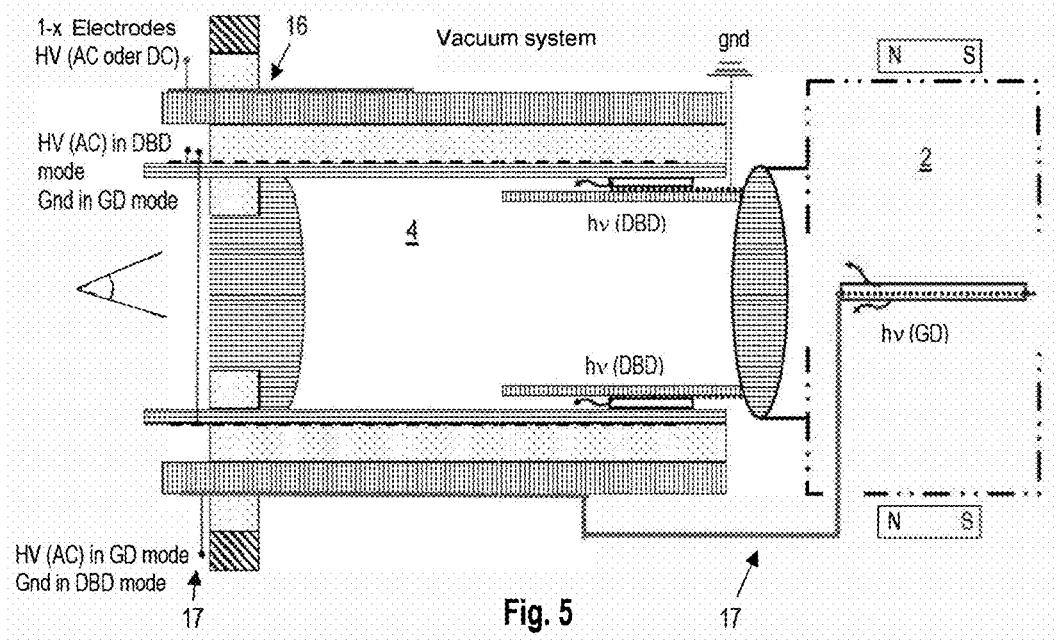
FIG. 5 shows another variant of the device.

FIG. 5 shows an alternative connection 17 to the anode of the first plasma source compared with the embodiment in FIG. 4. The feedthrough from the outside to the plasma side is designed as discussed in connection with FIG. 4 for the further electrode 16 and is opposite the further electrode 16 visible in longitudinal section by 180 degrees in the case shown with respect to the longitudinal axis of the device. Through a hole, the alternative connection 17 is led into the first discharge chamber 2 and contacts the central anode pin. This means that the electrical connection led centrally through the second discharge chamber 4 in the variant according to FIG. 4 and the associated feedthrough through the first optical lens 7 and second optical lens 8 can be omitted. This has the effect that a greater proportion of the electromagnetic radiation from the first or second plasma reaches the outside. Electrodes can, for example, be covered over their entire length with an insulating layer.

This has the advantage that in electron/ion optics often undesirable open potentials, which could influence charged particles, are avoided. For this purpose, for example, a glass ring lying over the electrodes can be further extended axially or individual conductive tracks can be realized with a thin glass layer, which lies overlapping over the respective conductive track.

Advantages of the present invention include integrating multiple plasma sources together in a single device, wherein the device also has only a single connection for introducing the gas to be analyzed and only a single connection for coupling the device to an optical sensor. With the device according to the invention, a stable plasma can be generated over a pressure range of over about 12 decades (in Torr), from high vacuum ($10^{-8}$ Torr) to above normal pressure (>atmospheric pressure, e.g. 1500 Torr). According to the invention, it is also provided to select and control the respective optimal plasma source depending on the pressure range by means of a device-internal pressure measurement.

LIST OF REFERENCE SIGNS

1 First plasma source
2 First discharge chamber
3 Second plasma source
4 Second discharge chamber
5 First coupling element
6 Second coupling element
7 First optical lens (between the two discharge chambers)
8 Second optical lens (in the second coupling element)
9 Anode of the first plasma source
10 High-voltage electrode of the second plasma source
11 Mass electrode of the second plasma source
12 Optical sensor (e.g. photodiode or spectrometer)
13 (Permanent) magnet
14 First plasma
15 Second plasma
16 Further electrode
17 Alternative connection to the anode of the first plasma source
L1 First optical connection
L2 Second optical connection

The invention claimed is:

1. A device for plasma generation in a wide pressure range comprising:
 a first plasma source, wherein the first plasma source is arranged in a first discharge chamber and is adapted to generate a first plasma in a low-pressure range;
 a second plasma source, wherein the second plasma source is arranged in a second discharge chamber and is adapted to generate a second plasma in a high-pressure range;
 a first coupling element for coupling the device to a system, wherein the coupling element is designed to lead gas out of the system;
 a second coupling element for coupling the device to an optical sensor,
 wherein the first discharge chamber has a first optical connection having at least one optical lens to the second coupling element, and the second discharge chamber has a second optical connection having at least one optical lens to the second coupling element.

2. The device according to claim 1, wherein the low-pressure range and the high-pressure range together extend over a specific pressure range.

3. The device according to claim 1, wherein the low-pressure range and the high-pressure range overlap.

4. The device according to claim 1, wherein the first and second plasma sources are different plasma sources.

5. The device according to claim 1, wherein the first discharge chamber is fluidically coupled to the second discharge chamber.

6. The device according to claim 1, wherein gas can be supplied from the first coupling element into the first discharge chamber and can be supplied from the first discharge chamber into the second discharge chamber.

7. The device according to claim 1, wherein an optical lens, which is part of the first optical connection, is arranged between the first discharge chamber and the second discharge chamber.

8. The device according to claim 1, wherein the second coupling element comprises an optical lens which is part of the first and/or the second optical connection.

9. The device according to claim 1, wherein the second optical connection is part of the first optical connection.

10. The device according to claim 1, wherein the device further comprises a pressure sensor.

11. The device according to claim 10, wherein the device further comprises a controller which is designed to control the first and/or the second plasma source as a function of the pressure determined by means of the pressure sensor.

12. The device according to claim 1, wherein the first discharge chamber and the second discharge chamber are of cylindrical design and are arranged coaxially one behind an other, wherein the first coupling element is arranged on the first discharge chamber and the second coupling element is arranged on the second discharge chamber.

13. The device according to claim 12, wherein an anode of the first plasma source is glazed in a vacuum-tight manner in a feedthrough through the optical lens in the second coupling element, and the anode extends coaxially through the second discharge chamber into the first discharge chamber.

14. The device according to claim 12, wherein the second plasma source has a high-voltage electrode and a ground electrode, wherein the high-voltage electrode is embedded in a dielectric which forms at least part of an inner wall of the second discharge chamber, and the ground electrode is arranged concentrically to the high-voltage electrode within the second discharge chamber and along the inner wall, at a distance of less than 1 mm from the high-voltage electrode, wherein a gap is located between the inner wall and the ground electrode, in which gap a discharge zone with a plasma is formed when an alternating voltage is applied between the high-voltage electrode and the ground electrode.

15. The device according to claim 12, wherein a high-voltage electrode is connectable to ground for operation of the first plasma source and is connectable to a high-voltage alternating current source for operation of the second plasma source, and/or wherein an anode is connectable to a high-voltage direct current source for operation of the first plasma source and is connectable to ground for operation of the second plasma source.

16. A system for optical gas analysis or gas detection comprising:
   a device for plasma generation according to claim 1;
   a gas source, wherein the device for plasma generation is coupled to the gas source with a first coupling element;
   an optical sensor, such as a photodiode or a spectrometer for optical gas analysis or gas detection, wherein the plasma generation device is coupled to the optical sensor by a second coupling element.

17. A method for plasma generation in a wide pressure range by means of the device according to claim 1, comprising the steps of:
   feeding a gas from a system via a first coupling element into a first discharge chamber having a first plasma source and/or into a second discharge chamber having a second plasma source;
   generating a first plasma by the first plasma source in a low-pressure range in the first discharge chamber, and/or generating a second plasma by the second plasma source in a high-pressure range in the second discharge chamber;
   guiding light which is emitted from the first plasma from the first discharge chamber via first optical connection having at least one optical lens and/or light emitted from the second plasma from the second discharge chamber via a second optical connection having at least one optical lens to a second coupling element for coupling the device to an optical sensor, such as a photodiode or a spectrometer;
   coupling out at least a portion of the light, which is emitted by the first and/or the second plasma, by the second coupling element.

18. The method according to claim 17, wherein the first and/or the second plasma source is controlled as a function of the pressure determined with a pressure sensor.

19. The method according to claim 18, wherein in a pressure range in which the low-pressure range and the high-pressure range overlap the first and second plasma sources.

20. The method for optical gas analysis or gas detection, comprising carrying out the steps according to claim 17 and further comprising the steps of:
   directing a decoupled light to an optical sensor;
   determining a gas or components of a gas or detecting a specific gas or specific components of a gas or determining a pressure of the gas based on the decoupled light.

* * * * *